(12) United States Patent
Wakayama et al.

(10) Patent No.: US 10,000,664 B2
(45) Date of Patent: Jun. 19, 2018

(54) UNDERLAYER FILM-FORMING COMPOSITION FOR SELF-ASSEMBLED FILMS

(71) Applicant: NISSAN CHEMICAL INDUSTRIES, LTD., Tokyo (JP)

(72) Inventors: Hiroyuki Wakayama, Toyama (JP); Makoto Nakajima, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 111 days.

(21) Appl. No.: 14/388,518

(22) PCT Filed: Mar. 22, 2013

(86) PCT No.: PCT/JP2013/058333
§ 371 (c)(1),
(2) Date: Sep. 26, 2014

(87) PCT Pub. No.: WO2013/146600
PCT Pub. Date: Oct. 3, 2013

(65) Prior Publication Data
US 2015/0118396 A1    Apr. 30, 2015

(30) Foreign Application Priority Data
Mar. 27, 2012  (JP) .................. 2012-071803

(51) Int. Cl.
| | | |
|---|---|---|
| B32B 7/00 | (2006.01) |
| C09D 183/04 | (2006.01) |
| C09D 5/00 | (2006.01) |
| C08G 77/00 | (2006.01) |
| G03F 7/00 | (2006.01) |
| B05D 1/00 | (2006.01) |
| B05D 3/02 | (2006.01) |
| B32B 7/02 | (2006.01) |
| H01L 21/033 | (2006.01) |

(52) U.S. Cl.
CPC ........... C09D 183/04 (2013.01); B05D 1/005 (2013.01); B05D 3/0254 (2013.01); C08G 77/80 (2013.01); C09D 5/00 (2013.01); G03F 7/0002 (2013.01); B32B 7/02 (2013.01); H01L 21/0332 (2013.01)

(58) Field of Classification Search
CPC ......... B32B 27/283; B32B 7/02; B05D 1/005; B05D 3/0254; C09D 183/04; C09D 5/00; H01L 21/0332
See application file for complete search history.

(56) References Cited

U.S. PATENT DOCUMENTS

| | | | |
|---|---|---|---|
| 5,247,043 A * | 9/1993 | Nakashima | C08G 77/06 528/14 |
| 5,755,867 A * | 5/1998 | Chikuni | C08K 3/22 106/287.11 |
| 7,491,967 B2 * | 2/2009 | Miura | H01L 51/0012 257/40 |
| 2001/0032568 A1 * | 10/2001 | Schutt | C09D 4/00 106/287.11 |
| 2003/0178626 A1 | 9/2003 | Sugiyama et al. | |
| 2005/0145864 A1 | 7/2005 | Sugiyama et al. | |
| 2008/0038467 A1 | 2/2008 | Jagannathan et al. | |
| 2008/0199789 A1 * | 8/2008 | Abdallah | C09D 183/06 430/21 |
| 2008/0233500 A1 | 9/2008 | De Jong et al. | |
| 2009/0036698 A1 | 2/2009 | Fujihira et al. | |
| 2009/0179002 A1 * | 7/2009 | Cheng | B82Y 10/00 216/41 |
| 2009/0239381 A1 * | 9/2009 | Nishimi | B01D 69/02 438/694 |
| 2012/0270981 A1 * | 10/2012 | Kim | G03F 7/0752 524/317 |
| 2012/0285929 A1 | 11/2012 | Matsumura et al. | |
| 2012/0315765 A1 * | 12/2012 | Nakajima | C07F 7/1836 438/694 |
| 2013/0183828 A1 * | 7/2013 | Nakamura | G03F 7/40 438/694 |
| 2013/0273330 A1 * | 10/2013 | Wang | B81C 1/0038 428/172 |
| 2014/0202984 A1 * | 7/2014 | Quesada | G03F 7/0002 216/11 |
| 2014/0370712 A1 * | 12/2014 | Kim | H01L 21/0271 438/702 |

FOREIGN PATENT DOCUMENTS

| | | |
|---|---|---|
| EP | 2 249 204 A1 | 11/2010 |
| EP | 2 372 458 A1 | 10/2011 |
| EP | 2 540 780 A1 | 1/2013 |
| EP | 2 560 049 A2 | 2/2013 |
| JP | S61-209268 A | 9/1986 |
| JP | H05-255648 A | 10/1993 |
| JP | 2002-194283 A | 7/2002 |
| JP | 2003-218383 A | 7/2003 |
| JP | 2004-307653 A | 11/2004 |
| JP | 2007-284623 A | 11/2007 |

(Continued)

OTHER PUBLICATIONS

Jun. 25, 2013 Written Opinion issued in International Application No. PCT/JP2013/058333.

(Continued)

*Primary Examiner* — Margaret G Moore
(74) *Attorney, Agent, or Firm* — Oliff PLC

(57) ABSTRACT

An underlayer film-forming composition used for an underlayer for a self-assembled film, including a polysiloxane and a solvent. The polysiloxane may be a hydrolysis-condensation product of a silane containing a phenyl group-containing silane, or a hydrolysis-condensation product of a silane containing a silane of Formula (1) in a ratio of 10 to 100% by mol relative to the total silane, or a hydrolysis-condensation product of silanes containing the silane of Formula (1), silane of Formula (2) [$R^4Si(R^3)_3$ (2)], and silane of Formula (3) [$Si(R^5)_4$ (3)] in a ratio of silane of Formula (1): silane of Formula (2): silane of Formula (3) of 10 to 100:0 to 90:0 to 50 in terms of % by mol relative to the total silane.

7 Claims, 3 Drawing Sheets

(56) References Cited

FOREIGN PATENT DOCUMENTS

| JP | 2008-143923 A | 6/2008 |
|---|---|---|
| JP | 2008-149447 A | 7/2008 |
| JP | 2008-242453 A | 10/2008 |
| JP | 2009-234114 A | 10/2009 |
| JP | 2011-122081 A | 6/2011 |
| JP | 2012-252323 A | 12/2012 |
| JP | 2013-083963 A | 5/2013 |
| WO | 2006/101028 A1 | 9/2006 |
| WO | 2011/102470 * | 8/2011 |
| WO | 2011/105368 A1 | 9/2011 |
| WO | 2013/073505 A1 | 5/2013 |

OTHER PUBLICATIONS

Jun. 25, 2013 International Search Report issued in International Application No. PCT/JP2013/058333.
Feb. 16, 2018 Office Action issued in European Application No. 13 769 608.4.

* cited by examiner

UNDERLAYER FILM-FORMING COMPOSITION FOR SELF-ASSEMBLED FILMS

TECHNICAL FIELD

The present invention provides an underlayer film-forming composition for self-assembled films that are formed by heat baking and are used for liquid crystal displays, recording materials for hard disks, solid-state image sensing devices, solar cell panels, light emitting diodes, organic light emitting devices, luminescent films, fluorescent films, MEMSs, actuators, anti-reflective materials, resists, resist underlayer films, resist upper layer films, templates (molds) for nanoimprint, and other devices. The present invention also relates to a method for forming a self-assembled film using the self-assembled film and the underlayer film and a method for forming a processing pattern.

BACKGROUND ART

Self-assembled films having a nanoscale repeating structure are known to have different characteristics from those of common homogeneous films, and a self-assembled film having a nanoscale repeating structure including a block copolymer has been developed.

The characteristics of a mixture of an organic photochromic material with a non-curable polystyrene/poly(methyl methacrylate) copolymer have been disclosed.

The characteristics of nano-patterning prepared by plasma etching of a non-curable polystyrene/poly(methyl methacrylate) copolymer have been disclosed.

The characteristics of nano-patterning prepared by using a non-curable polystyrene/poly(methyl methacrylate) copolymer have been disclosed.

A coating composition has been disclosed that is used for thin films and includes a block polymer configured to contain a polymer chain having a fluorine-containing vinyl monomer unit and a polymer chain including a vinyl monomer unit having at least a silyl group (see Patent Document 1).

A pattern formation method by regularly arranging a plurality of segments constituting a block polymer to form a pattern in a block polymer layer has been disclosed (see Patent Document 2).

A film-forming composition including a block copolymer, a crosslinking agent, and an organic solvent has been disclosed. In a self-assembled film prepared by using the film-forming composition, an underlayer film (for example, an organic film is used) can have pattern information in order to pattern the block polymer in a cylinder shape. In order to arrange a pattern at an intended position on an underlayer film (for example, an organic film) on a processing substrate, ultraviolet rays or radiation rays are applied so as to overlap with the arranging position to cause a variation of unevenness or surface energy (hydrophilic/hydrophobic). Thus, a polymer chain (A) component and a polymer chain (B) component in a (self-assembled) film-forming composition including a block polymer can be arranged at respective intended positions (see Patent Document 3).

PRIOR ART DOCUMENTS

Patent Documents

Patent Document 1: Japanese Patent Application Publication No. 2007-284623 (JP 2007-284623 A)

Patent Document 2: Japanese Patent Application Publication No. 2009-234114 (JP 2009-234114 A)

Patent Document 3: Japanese Patent Application Publication No. 2011-122081 (JP 2011-122081 A)

SUMMARY OF THE INVENTION

Problem to be Solved by the Invention

An object of the present invention is to provide a composition for forming an underlayer film that is required to easily arrange a self-assembled film into a desired vertical pattern when the self-assembled film including a block polymer or other components is formed. Another object of the present invention is to provide a composition that is used for forming an underlayer film for self-assembled films and that causes no intermixing (layer mixing) with a self-assembled film as the upper layer and has resistance to oxygen gas during pattern etching of the self-assembled film.

Means for Solving the Problem

The present invention provides: as a first aspect, an underlayer film-forming composition for self-assembled films, the underlayer film-forming composition comprising a polysiloxane and a solvent;

as a second aspect, the underlayer film-forming composition for self-assembled films according to the first aspect, in which the polysiloxane is a hydrolysis-condensation product of a silane containing a phenyl group-containing silane;

as a third aspect, the underlayer film-forming composition for self-assembled films according to the first aspect or the second aspect, in which the polysiloxane is a hydrolysis-condensation product of a silane containing a silane of Formula (1):

$$R^2Si(R^1)_3 \qquad \text{Formula (1)}$$

(where $R^1$ is an alkoxy group, an acyloxy group, or a halogen atom; and $R^2$ is an organic group containing a benzene ring optionally having a substituent and is a group bonded to the silicon atom through a Si—C bond) in a ratio of 10 to 100% by mol relative to the total silane;

as a fourth aspect, the underlayer film-forming composition for self-assembled films according to any one of the first aspect to the third aspect, in which the polysiloxane is a hydrolysis-condensation product of silanes containing the silane of Formula (1), a silane of Formula (2), and a silane of Formula (3) in a ratio of the silane of Formula (1): the silane of Formula (2): the silane of Formula (3) of 10 to 100:0 to 90:0 to 50 in terms of % by mol relative to the total silane:

$$R^4Si(R^3)_3 \qquad \text{Formula (2)}$$

$$Si(R^5)_4 \qquad \text{Formula (3)}$$

(where $R^3$ and $R^5$ are each an alkoxy group, an acyloxy group, or a halogen atom; and $R^4$ is an organic group containing a hydrocarbon optionally having a substituent and is a group bonded to the silicon atom through a Si—C bond);

as a fifth aspect, the underlayer film-forming composition for self-assembled films according to any one of the first aspect to the fourth aspect, in which the polysiloxane is a hydrolysis-condensation product of silanes containing the silane of Formula (1) and the silane of Formula (2) in a ratio of 10 to 100:0 to 90 in terms of % by mol relative to the total silane;

as a sixth aspect, the underlayer film-forming composition for self-assembled films according to any one of the third aspect to the fifth aspect, in which $R^2$ is a phenyl group;

as a seventh aspect, the underlayer film-forming composition for self-assembled films according to any one of the fourth aspect to the sixth aspect, in which $R^4$ is a methyl group or a vinyl group;

as an eighth aspect, the underlayer film-forming composition for self-assembled films according to any one of the first aspect to the seventh aspect, further comprising an acid;

as a ninth aspect, the underlayer film-forming composition for self-assembled films according to any one of the first aspect to the eighth aspect, further comprising a curing catalyst;

as a tenth aspect, the underlayer film-forming composition for self-assembled films according to any one of the first aspect to the ninth aspect, further comprising water;

as an eleventh aspect, the underlayer film-forming composition for self-assembled films according to any one of the first aspect to the tenth aspect, in which the self-assembled film is a block polymer including an organic polymer chain (A) that contains an organic monomer (a) as a unit structure and an organic polymer chain (B) that contains an organic monomer (b) different from the organic monomer (a) as a unit structure and is bonded to the organic polymer chain (A);

as a twelfth aspect, the underlayer film-forming composition for self-assembled films according to the eleventh aspect, in which the block polymer is a block copolymer of a combination of a polystyrene (A) and a polymethyl methacrylate (B), a combination of a polystyrene (A) and a polyisoprene (B), or a combination of a polystyrene (A) and a polybutadiene (B);

as a thirteenth aspect, the underlayer film-forming composition for self-assembled films according the eleventh aspect or the twelfth aspect, in which the polysiloxane has a water contact angle between a water contact angle of the organic polymer chain (A) of the block polymer and a water contact angle of the organic polymer chain (B) of the block polymer;

as a fourteenth aspect, a method for forming a pattern structure, the method comprising applying the underlayer film-forming composition for self-assembled films as described in any one of the first aspect to the thirteenth aspect onto a substrate and baking the composition to form an underlayer film; and subsequently applying a self-assembled film-forming composition onto the underlayer film and baking the composition to form a self-assembled film; and as a fifteenth aspect, a method for producing a device, the method comprising using an underlayer film for self-assembled films, the underlayer film being formed from the underlayer film-forming composition for self-assembled films as described in any one of the first aspect to the thirteenth aspect.

Effects of the Invention

The underlayer film-forming composition for self-assembled films of the present invention comprises a particular amount of a polysiloxane that is a hydrolysis-condensation product of a silane containing a phenyl group-containing silane, and thus an underlayer film formed from the underlayer film-forming composition orients a microphase-separated structure such as a lamellar structure or a cylinder structure in a self-assembled film on the underlayer film, in a perpendicular direction to the film surface. Consequently, an effect is achieved in which a perpendicular microphase-separated structure such as a perpendicular lamellar structure or a perpendicular cylinder structure can be formed in a self-assembled film.

An underlayer film formed from the underlayer film-forming composition for self-assembled films of the present invention causes no intermixing (layer mixing) with a self-assembled film as the upper layer and has resistance to oxygen gas during pattern etching of the self-assembled film.

MODES FOR CARRYING OUT THE INVENTION

Figure 1:
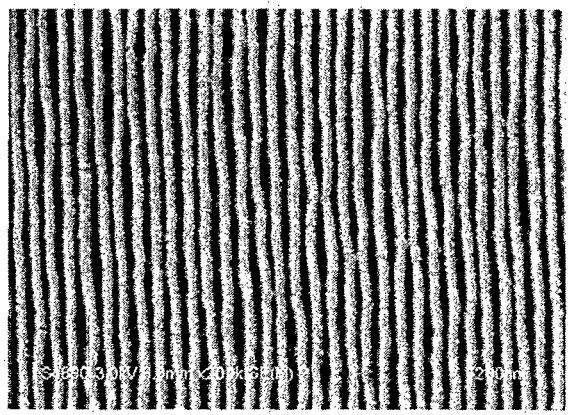
FIG. 1 is an electron micrograph (a magnification of 200,000 times) showing a state in which a perpendicular lamellar structure was formed by applying a self-assembled film including a block copolymer 1 onto an underlayer film obtained from Example 3.
Figure 2:
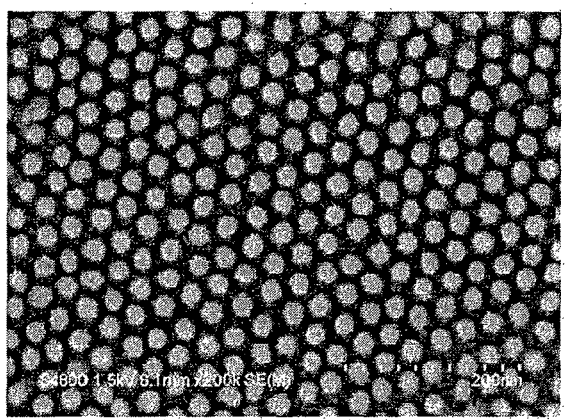
FIG. 2 is an electron micrograph (a magnification of 200,000 times) showing a state in which a perpendicular cylinder structure was formed by applying a self-assembled film including a block copolymer 2 onto the underlayer film obtained from Example 3.
Figure 3:
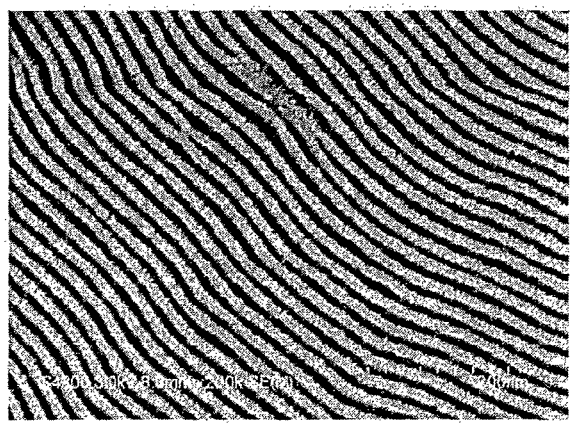
FIG. 3 is an electron micrograph (a magnification of 200,000 times) showing a state in which a perpendicular lamellar structure was formed by applying a self-assembled film including the block copolymer 1 onto an underlayer film obtained from Example 6.
Figure 4:
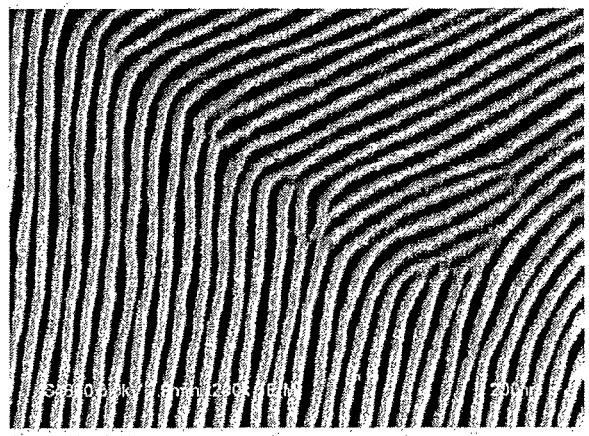
FIG. 4 is an electron micrograph (a magnification of 200,000 times) showing a state in which a perpendicular lamellar structure was formed by applying a self-assembled film including the block copolymer 1 onto an underlayer film obtained from Example 8.
Figure 5:
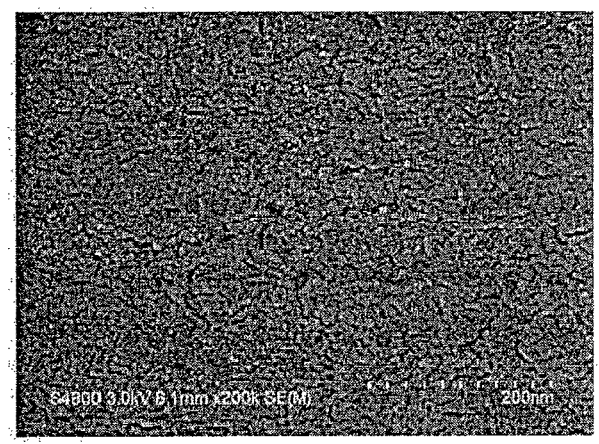
FIG. 5 is an electron micrograph (a magnification of 200,000 times) showing a state in which a horizontal lamellar structure was formed by applying a self-assembled film including the block copolymer 1 onto an underlayer film obtained from Comparative Example 1.
Figure 6:
FIG. 6 is an electron micrograph (a magnification of 200,000 times) showing a state in which a horizontal cylinder structure was formed by applying a self-assembled film including the block copolymer 2 onto the underlayer film obtained from Comparative Example 1.

A self-assembled film obtained by heat baking and used in the present invention includes a block polymer including an organic polymer chain (A) that contains an organic monomer (a) as a unit structure and an organic polymer chain (B) that contains an organic monomer (b) different from the organic monomer (a) as a unit structure and is bonded to the organic polymer chain (A).

In order to induce such a block polymer to cause microphase separation and to be self-assembled, an underlayer film formed from the underlayer film-forming composition of the present invention is used as the underlayer film. The underlayer film includes a phenyl group-containing silane, and the phenyl group-containing silane allows a self-assembling polymer present in the upper layer to cause microphase separation and to form a self-assembled film having a perpendicular lamellar structure or a perpendicular cylinder structure.

A polysiloxane in the underlayer film contains a phenyl group-containing silane of Formula (1) in a ratio of 10 to 100% by mol relative to the total silane and may contain additional silanes such as hydrocarbon group-containing silanes corresponding to a silane of Formula (2) and a silane of Formula (3) and tetraalkoxysilanes.

The polysiloxane in the underlayer film preferably has a water contact angle between a water contact angle of the organic polymer chain (A) of the block polymer and a water contact angle of the organic polymer chain (B) of the block polymer in order to induce the microphase separation.

The microphase-separated, self-assembled film as above is supposed to be variously applied by using differences in polymer characteristics between the organic polymer chain (A) and the organic polymer chain (B). For example, by using differences in etching rate (the difference in alkali dissolution rate or the difference in gas etching rate) between the polymers, a pattern corresponding to a resist pattern can be formed.

The present invention provides an underlayer film-forming composition that is used for self-assembled films and comprises a polysiloxane and a solvent. The underlayer film-forming composition for self-assembled films is a composition for forming a film present as the underlayer of a self-assembled film. By applying the film-forming composition onto a substrate and baking the composition, an underlayer film is formed. By applying a self-assembled film-forming composition onto the underlayer film and drying the composition, a self-assembled film is formed.

The polysiloxane may be a hydrolysis-condensation product of a silane containing a phenyl group-containing silane.

The underlayer film-forming composition may have a solid content of 0.01 to 20% by mass, 0.01 to 15% by mass, or 0.1 to 15% by mass. The solid content is the ratio of a residue obtained by removing solvents and water from the underlayer film-forming composition.

The ratio of the polysiloxane may be 60 to 100% by mass, 70 to 99% by mass, or 70 to 99% by mass in the solid content.

The polysiloxane is preferably a hydrolysis-condensation product of a silane that contains a silane of Formula (1) in a ratio of 10 to 100% by mol relative to the total silane.

In Formula (1), $R^1$ is a hydrolyzable group such as alkoxy groups, acyloxy groups, and halogen atoms.

The alkoxy group for $R^1$ in Formula (1) is exemplified by alkoxy groups having a linear, branched, or cyclic alkyl moiety with a carbon atom number of 1 to 20. Examples of the alkoxy group include a methoxy group, an ethoxy group, an n-propoxy group, an i-propoxy group, an n-butoxy group, an i-butoxy group, an s-butoxy group, a t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-i-propyl-cyclopropoxy group, a 2-i-propyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

The acyloxy group for $R^1$ in Formula (1) is exemplified by $C_{2\text{-}20}$ acyloxy groups. Examples of the acyloxy group include a methylcarbonyloxy group, an ethylcarbonyloxy group, an n-propylcarbonyloxy group, an i-propylcarbonyloxy group, an n-butylcarbonyloxy group, an i-butylcarbonyloxy group, an s-butylcarbonyloxy group, a t-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

The halogen atom for $R^1$ in Formula (1) is exemplified by fluorine, chlorine, bromine, and iodine.

In Formula (1), $R^2$ is an organic group containing a benzene ring optionally having a substituent and is a group bonded to the silicon atom through a Si—C bond.

The organic group containing a benzene ring is exemplified by combinations of a benzene ring with an alkylene group, and examples include aralkyl groups (alkyl groups substituted with an aryl group) such as $C_{1\text{-}10}$ alkyls substituted with a phenyl. Specific examples include a benzyl group, an ethylphenyl group, a propylphenyl group, and a butylphenyl group.

The organic group containing a benzene ring is also exemplified by a phenyl group and can be exemplified by phenyltrialkoxysilanes formed by bonding a phenyl group to the silicon atom of a hydrolyzable silane.

Examples of the substituent that can be substituted on the benzene ring include halogen atoms, a nitro group, an amino group, a carboxylic acid group, a hydroxy group, an epoxy group, a thiol group, organic groups containing an ether bond, organic groups containing a ketone bond, organic groups containing an ester bond, and groups formed by combining them.

The polysiloxane used in the present invention may be a combination of the silane of Formula (1) with a silane of Formula (2) and, additionally, a silane of Formula (3). A co-hydrolysis-condensation product of such a silane combination may be used. These silanes may be used as a hydrolysis-condensation product of silanes containing the silane of Formula (1), the silane of Formula (2), and the silane of Formula (3) in ratios of 10 to 100, 0 to 90, and 0 to 50, respectively, in terms of % by mol relative to the total silane. The polysiloxane may also be a hydrolysis-condensation product of silanes that contain the silane of Formula (1) and the silane of Formula (2) in ratios of 10 to 100 and 0 to 90, respectively, in terms of % by mol relative to the total silane.

In the silane of Formula (2) and the silane of Formula (3), $R^3$ and $R^5$ are each an alkoxy group, an acyloxy group, or a halogen atom, and the groups are exemplified by the above-mentioned examples. $R^4$ is an organic group containing a hydrocarbon optionally having a substituent and is a group bonded to the silicon atom through a Si—C bond.

The hydrocarbon group for $R^4$ in Formula (2) is exemplified by alkyl groups and alkenyl groups.

The alkyl group is a linear or branched alkyl group having a carbon atom number of 1 to 10. Examples of the alkyl group include a methyl group, an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group. The alkyl group may be a cyclic alkyl group. Examples of the cyclic $C_{1-10}$ alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

The alkenyl group is a $C_{2-10}$ alkenyl group. Examples of the alkenyl group include an ethenyl group (vinyl group), a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and 3-cyclohexenyl group.

The organic group containing a hydrocarbon for $R^4$ may be a methyl group or a vinyl group.

The substituent that can be substituted on the hydrocarbon group can be exemplified by the above-mentioned substituents.

The hydrolysis-condensation product (polyorganosiloxane) of a silane may be a condensation product having a weight average molecular weight of 500 to 1,000,000 or 500 to 100,000. These molecular weights are in terms of polystyrene determined by GPC analysis.

The GPC measurement can be carried out under conditions, for example, using a GPC apparatus (trade name: HLC-8220GPC, manufactured by Tosoh Corporation), using a GPC column (trade name: Shodex KF803L, KF802, KF801, manufactured by Showa Denko K.K.), at a column temperature of 40° C., using tetrahydrofuran as the eluent (elution solvent), at a flow rate (flow speed) of 1.0 ml/min, and using polystyrene (manufactured by Showa Denko K.K.) as the standard sample.

For the hydrolysis of an alkoxy silyl group, an acyloxy silyl group, or a halogenated silyl group, 0.5 to 100 mol, preferably, 1 to 10 mol of water is used relative to 1 mol of the hydrolyzable group.

Relative to 1 mol of the hydrolyzable group, 0.001 to 10 mol, preferably, 0.001 to 1 mol of a hydrolysis catalyst can be used.

The reaction temperature during the hydrolysis and condensation is typically 20 to 80° C.

The hydrolysis may be carried out completely or partially. In other words, hydrolysates or monomers may remain in the hydrolysis-condensation product.

During the hydrolysis and condensation, a catalyst may be used.

Examples of the hydrolysis catalyst include metal chelate compounds, organic acids, inorganic acids, organic bases, and inorganic bases.

Examples of the metal chelate compound as the hydrolysis catalyst include titanium chelate compounds such as triethoxy-mono(acetylacetonate)titanium, tri-n-propoxy-mono(acetylacetonate)titanium, tri-i-propoxy-mono(acetylacetonate)titanium, tri-n-butoxy-mono(acetylacetonate)titanium, tri-sec-butoxy-mono(acetylacetonate)titanium, tri-t-butoxy-mono(acetylacetonate)titanium, diethoxy-bis(acetylacetonate)titanium, di-n-propoxy-bis(acetylacetonate)titanium, di-i-propoxy-bis(acetylacetonate)titanium, di-n-butoxy-bis(acetylacetonate)titanium, di-sec-butoxy-bis(acetylacetonate)titanium, di-t-butoxy-bis(acetylacetonate)titanium, monoethoxy-tris(acetylacetonate)titanium, mono-n-propoxy-tris(acetylacetonate)titanium, mono-i-propoxy-tris(acetylacetonate)titanium, mono-n-butoxy-tris(acetylacetonate)titanium, mono-sec-butoxy-tris(acetylacetonate)titanium, mono-t-butoxy-tris(acetylacetonate)titanium, tetrakis(acetylacetonate)titanium, triethoxy-mono(ethylacetoacetate)titanium, tri-n-propoxy-mono(ethylacetoacetate)titanium, tri-i-propoxy-mono(ethylacetoacetate)titanium, tri-n-butoxy-mono(ethylacetoacetate)titanium, tri-sec-butoxy-mono(ethylacetoacetate)titanium, tri-t-butoxy-mono(ethylacetoacetate)titanium, diethoxy-bis(ethylacetoacetate)titanium, di-n-propoxy-bis(ethylacetoacetate)titanium, di-i-propoxy-bis(ethylacetoacetate)titanium, di-n-butoxy-bis(ethylacetoacetate)titanium, di-sec-butoxy-bis(ethylacetoacetate)titanium, di-t-butoxy-bis(ethylacetoacetate)titanium, monoethoxy-tris(ethylacetoacetate)titanium, mono-n-propoxy-tris(ethylacetoacetate)titanium, mono-i-propoxy-tris(ethylacetoacetate)titanium, mono-n-butoxy-tris(ethylacetoacetate)titanium, mono-sec-butoxy-tris(ethylacetoacetate)titanium, mono-t-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium;

zirconium chelate compounds such as triethoxy-mono(acetylacetonate)zirconium, tri-n-propoxy-mono(acetylacetonate)zirconium, tri-i-propoxy-mono(acetylacetonate)zirconium, tri-n-butoxy-mono(acetylacetonate)zirconium, tri-sec-butoxy-mono(acetylacetonate)zirconium, tri-t-butoxy-mono(acetylacetonate)zirconium, diethoxy-bis(acetylacetonate)zirconium, di-n-propoxy-bis(acetylacetonate)zirconium, di-i-propoxy-bis(acetylacetonate)zirconium, di-n-butoxy-bis(acetylacetonate)zirconium, di-sec-butoxy-bis(acetylacetonate)zirconium, di-t-butoxy-bis(acetylacetonate)zirconium, monoethoxy-tris(acetylacetonate)zirconium, mono-n-propoxy-tris(acetylacetonate)zirconium, mono-i-propoxy-tris(acetylacetonate)zirconium, mono-n-butoxy-tris(acetylacetonate)zirconium, mono-sec-butoxy-tris(acetylacetonate)zirconium, mono-t-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, tri-i-propoxy-mono(ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate)zirconium, diethoxy-bis(ethylacetoacetate)zirconium, di-n-propoxy-bis(ethylacetoacetate)zirconium, di-i-propoxy-bis(ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris(ethylacetoacetate)zirconium, mono-t-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Examples of the organic acid as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, fotinic acid, malonic acid, sulfonic acid, phthalic acid, fumaric acid, citric acid, and tartaric acid.

Examples of the inorganic acid as the hydrolysis catalyst include hydrochloric acid, nitric acid, sulfuric acid, hydrofluoric acid, and phosphoric acid.

Examples of the organic base as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compounds, the organic acids, and the inorganic acids are preferred, and these catalysts may be used singly or two or more of them may be used in combination.

Examples of the organic solvent used for the hydrolysis include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcoholic solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcoholic solvents such as ethylene glycol, propylene glycol, 1,3-butylene glycol, pentanediol-2,4, 2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran;

Ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propane sultone. These solvents may be used singly or in combination of two or more of them.

In particular, ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone (1,1,3-trimethyl-2-norbornene) are preferred in terms of the storage stability of a solution.

The underlayer film-forming composition of the present invention can contain a curing catalyst. The curing catalyst works as the curing catalyst when a coating film containing a polyorganosiloxane composed of a hydrolysis-condensation product is heated to be cured.

Usable examples of the curing catalyst include ammonium salts, phosphines, phosphonium salts, and sulfonium salts.

Examples of the ammonium salt include quaternary ammonium salts having the structure of Formula (C-1):

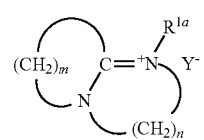

Formula (C-1)

(where m is an integer of 2 to 11; n is an integer of 2 to 3; $R^{1a}$ is an alkyl group or an aryl group; and $Y^-$ is an anion), quaternary ammonium salts having the structure of Formula (C-2):

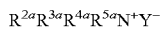

$$R^{2a}R^{3a}R^{4a}R^{5a}N^+Y^-$$  Formula (C-2)

(where $R^{2a}$, $R^{3a}$, $R^{4a}$, and $R^{5a}$ are each an alkyl group or an aryl group; N is a nitrogen atom; $Y^-$ is an anion; and each of $R^{2a}$, $R^{3a}$, $R^{4a}$, and $R^{5a}$ is bonded to the nitrogen atom through a C—N bond), quaternary ammonium salts having the structure of Formula (C-3):

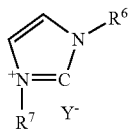
Formula (C-3)

(where $R^6$ and $R^7$ are each an alkyl group or an aryl group; and $Y^-$ is an anion),
quaternary ammonium salts having the structure of Formula (C-4):

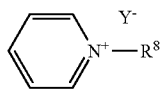
Formula (C-4)

(where $R^8$ is an alkyl group or an aryl group; and $Y^-$ is an anion),
quaternary ammonium salts having the structure of Formula (C-5):

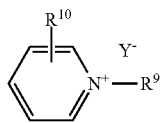
Formula (C-5)

(where $R^9$ and $R^{10}$ are each an alkyl group or an aryl group; and $Y^-$ is an anion), and
tertiary ammonium salts having the structure of Formula (C-6):

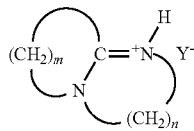
Formula (C-6)

(where m is an integer of 2 to 11; n is an integer of 2 to 3; H is a hydrogen atom; and $Y^-$ is an anion).

Examples of the phosphonium salt include quaternary phosphonium salts of Formula (C-7):

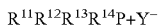
$R^{11}R^{12}R^{13}R^{14}P^+Y^-$  Formula (C-7)

(where $R^{11}$, $R^{12}$, $R^{13}$, and $R^{14}$ are each an alkyl group or an aryl group; P is a phosphorus atom; $Y^-$ is an anion; and each of $R^{11}$, $R^{12}$, $R^{13}$, and $R^{14}$ is bonded to the phosphorus atom through a C—P bond).

Examples of the sulfonium salt include tertiary sulfonium salts of Formula (C-8):

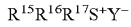
$R^{15}R^{16}R^{17}S^+Y^-$  Formula (C-8)

(where $R^{15}$, $R^{16}$, and $R^{17}$ are each an alkyl group or an aryl group; S is a sulfur atom; $Y^-$ is an anion; and each of $R^{15}$, $R^{16}$, and $R^{17}$ is bonded to the sulfur atom through a C—S bond).

The compound of Formula (C-1) is a quaternary ammonium salt derived from an amine, m is an integer of 2 to 11, and n is an integer of 2 to 3. $R^{1a}$ of the quaternary ammonium salt is a $C_{1-18}$, preferably, $C_{2-10}$ alkyl group or an aryl group, which is exemplified by linear alkyl groups such as an ethyl group, a propyl group, and a butyl group, a benzyl group, a cyclohexyl group, a cyclohexylmethyl group, and a dicyclopentadienyl group. Examples of the anion ($Y^-$) include halogen ions such as a chloride ion ($Cl^-$), a bromide ion ($Br^-$), and an iodide ion ($I^-$) and acid groups such as carboxylate (—$COO^-$), sulfonate (—$SO_3^-$), and alcoholate (—$O^-$).

The compound of Formula (C-2) is a quaternary ammonium salt of $R^{2a}R^{3a}R^{4a}R^{5a}N^+Y^-$. $R^{2a}$, $R^{3a}$, $R^{4a}$, and $R^{5a}$ of the quaternary ammonium salt are each a $C_{1-18}$ alkyl group, an aryl group, or a silane compound containing an alkyl group bonded to a silicon atom through a Si—C bond. Examples of the anion ($Y^-$) include halogen ions such as a chloride ion ($Cl^-$), a bromide ion ($Br^-$), and an iodide ion ($I^-$) and acid groups such as carboxylate (—$COO^-$), sulfonate (—$SO_3^-$), and alcoholate (—$O^-$).

The quaternary ammonium salts are commercially available and are exemplified by tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (C-3) is a quaternary ammonium salt derived from a 1-substituted imidazole, and $R^6$ and $R^7$ are each a hydrogen atom, a $C_{1-18}$ alkyl group, or an aryl group. Examples of $R^6$ include a hydrogen atom, a methyl group, an ethyl group, a propyl group, a phenyl group, a benzyl group, and silane compounds containing an alkyl group bonded to a silicon atom through a Si—C bond, and examples of $R^7$ include a hydrogen atom, a benzyl group, an octyl group, an octadecyl group, and silane compounds containing an alkyl group bonded to a silicon atom through a Si—C bond. Examples of the anion ($Y^-$) include halogen ions such as a chloride ion ($Cl^-$), a bromide ion ($Br^-$), and an iodide ion ($I^-$) and acid groups such as carboxylate (—$COO^-$), sulfonate (—$SO_3^-$), and alcoholate (—$O^-$). The compounds are commercially available or can be produced by reacting an imidazole compound such as 1-methylimidazole and 1-benzylimidazole with a halogenated alkyl or a halogenated aryl such as benzyl bromide and methyl bromide, for example. An ammonium salt of N-(3-triethoxysilylpropyl)-4,5-dihydroimidazole can be exemplified.

The compound of Formula (C-4) is a quaternary ammonium salt derived from pyridine, and $R^8$ is a $C_{1-18}$, preferably, $C_{4-18}$ alkyl group or an aryl group, which can be exemplified by a butyl group, an octyl group, a benzyl group, and a lauryl group. Examples of the anion ($Y^-$) include halogen ions such as a chloride ion ($Cl^-$), a bromide ion ($Br^-$), and an iodide ion ($I^-$) and acid groups such as carboxylate (—$COO^-$), sulfonate (—$SO_3^-$), and alcoholate (—$O^-$). The compounds are commercially available or can be produced by reacting pyridine with a halogenated alkyl or a halogenated aryl such as lauryl chloride, benzyl chloride, benzyl bromide, methyl bromide, and octyl bromide, for example. The compounds can be exemplified by N-laurylpyridinium chloride and N-benzylpyridinium bromide.

The compound of Formula (C-5) is a quaternary ammonium salt derived from a substituted pyridine typified by picoline, and $R^9$ is a $C_{1-18}$, preferably, $C_{4-18}$ alkyl group or an aryl group, which can be exemplified by a methyl group, an octyl group, a lauryl group, and a benzyl group. $R^{10}$ is a $C_{1-18}$ alkyl group or an aryl group. For example, for a quaternary ammonium derived from picoline, $R^{10}$ is a methyl group. Examples of the anion ($Y^-$) include halogen ions such as a chloride ion ($Cl^-$), a bromide ion ($Br^-$), and an iodide ion (I⁻) and acid groups such as carboxylate (—COO⁻), sulfonate (—SO₃⁻), and alcoholate (—O⁻). The compounds are commercially available or can be produced by reacting a substituted pyridine such as picoline with a halogenated alkyl or a halogenated aryl such as methyl bromide, octyl bromide, lauryl chloride, benzyl chloride, and benzyl bromide, for example. The compound can be exemplified by N-benzylpicolinium chloride, N-benzylpicolinium bromide, and N-laurylpicolinium chloride.

The compound of Formula (C-6) is a tertiary ammonium salt derived from an amine, m is an integer of 2 to 11, and n is an integer of 2 to 3. Examples of the anion (Y⁻) include halogen ions such as a chloride ion (Cl⁻), a bromide ion (Br⁻), and an iodide ion (I⁻) and acid groups such as carboxylate (—COO⁻), sulfonate (—SO₃⁻), and alcoholate (—O⁻). The compound can be produced by reacting an amine with a weak acid such as carboxylic acids and phenol. Examples of the carboxylic acid include formic acid and acetic acid. When formic acid is used, the anion (Y⁻) is (HCOO⁻), and when acetic acid is used, the anion (Y⁻) is (CH₃COO⁻). When phenol is used, the anion (Y⁻) is (C₆HO⁻).

The compound of Formula (C-7) is a quaternary phosphonium salt having the structure of $R^{11}R^{12}R^{13}R^{14}P^+Y^-$. $R^{11}$, $R^{12}$, $R^{13}$, and $R^{14}$ are each a $C_{1-18}$ alkyl group, an aryl group, or a silane compound bonded to a silicon atom through a Si—C bond. It is preferable that three of four substituents of $R^{11}$ to $R^{14}$ be a phenyl group or a substituted phenyl group, which can be exemplified by a phenyl group and a tolyl group, and the remaining one substituent is a $C_{1-18}$ alkyl group, an aryl group, or a silane compound bonded to a silicon atom through a Si—C bond. Examples of the anion (Y⁻) include halogen ions such as a chloride ion (Cl⁻), a bromide ion (Br⁻), and an iodide ion (I⁻) and acid groups such as carboxylate (—COO⁻), sulfonate (—SO₃⁻), and alcoholate (—O⁻). The compounds are commercially available and exemplified by halogenated tetraalkylphosphoniums such as halogenated tetra-n-butylphosphoniums and halogenated tetra-n-propylphosphoniums, halogenated trialkylbenzylphosphoniums such as halogenated triethylbenzylphosphoniums, halogenated triphenylmonoalkylphosphoniums such as halogenated triphenylmethylphosphoniums and halogenated triphenylethylphosphoniums, halogenated triphenylbenzylphosphoniums, halogenated tetraphenylphosphoniums, halogenated tritolylmonoarylphosphoniums, and halogenated tritolylmonoalkylphosphoniums (the halogen atom is a chlorine atom or a bromine atom). In particular, halogenated triphenylmonoalkylphosphoniums such as halogenated triphenylmethylphosphoniums and halogenated triphenylethylphosphoniums, halogenated triphenylmonoarylphosphoniums such as halogenated triphenylbenzylphosphoniums, halogenated tritolylmonoarylphosphoniums such as halogenated tritolylmonophenylphosphoniums, and halogenated tritolylmonoalkylphosphoniums such as halogenated tritolylmonomethylphosphoniums (the halogen atom is a chlorine atom or a bromine atom) are preferred.

Examples of the phosphine include primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (C-8) is a tertiary sulfonium salt having the structure of $R^{15}R^{16}R^{17}S^+Y^-$. $R^{15}$, $R^{16}$, and $R^{17}$ are each a $C_{1-18}$ alkyl group, an aryl group, or a silane compound bonded to a silicon atom through a Si—C bond. It is preferable that three of four substituents of $R^{15}$ to $R^{17}$ be a phenyl group or a substituted phenyl, group, which can be exemplified by a phenyl group and a tolyl group, and the remaining one substituent is a $C_{1-18}$ alkyl group or an aryl group. Examples of the anion (Y⁻) include halogen ions such as a chloride ion (Cl⁻), a bromide ion (Br⁻), and an iodide ion (I⁻) and acid groups such as carboxylate (—COO⁻), sulfonate (—SO₃⁻), and alcoholate (—O⁻). The compounds are commercially available and exemplified by halogenated tetraalkylsulfoniums such as halogenated tri-n-butylsulfoniums and halogenated tri-n-propylsulfoniums; halogenated trialkylbenzylsulfoniums such as halogenated diethylbenzylsulfoniums; halogenated diphenylmonoalkylsulfoniums such as halogenated diphenylmethylsulfoniums and halogenated diphenylethylsulfoniums; halogenated triphenylsulfoniums (the halogen atom is a chlorine atom or a bromine atom); tetraalkylphosphonium carboxylates such as tri-n-butylsulfonium carboxylate and tri-n-propylsulfonium carboxylate; trialkylbenzylsulfonium carboxylates such as diethylbenzylsulfonium carboxylate; diphenylmonoalkylsulfonium carboxylates such as diphenylmethylsulfonium carboxylate and diphenylethylsulfonium carboxylate; and triphenylsulfonium carboxylate. In particular, the halogenated triphenylsulfoniums and the triphenylsulfonium carboxylate are preferred.

The curing catalyst is used in an amount of 0.01 to 10 parts by mass, 0.01 to 5 parts by mass, or 0.01 to 3 parts by mass relative to 100 parts by mass of the hydrolysis-condensation product (polyorganosiloxane).

In the present invention, the curing catalyst may be selected from amine compounds, sulfide compounds, and phosphine compounds corresponding to the ammonium salts, the sulfonium salts, and the phosphonium salts.

The underlayer film-forming composition for self-assembled films of the present invention may contain an acid generator.

Examples of the acid generator include thermal acid generators and photo acid generators.

The underlayer film-forming composition for self-assembled films of the present invention may be subjected to electron beam lithography or laser exposure to form a resist pattern before a self-assembled film is formed. The photo acid generator generates acids during the exposure of a resist, and thus can control the acidity of an underlayer film. This is one method for matching the acidity of the underlayer film to the acidity of an upper layer resist. The adjustment of the acidity of the underlayer film allows the adjustment of a pattern shape of a resist formed as the upper layer.

The photo acid generator contained in the underlayer film-forming composition for self-assembled films of the present invention is exemplified by onium salt compounds, sulfonimide compounds, and disulfonyldiazomethane compounds.

Examples of the onium salt compound include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro-n-butanesulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo acid generators may be used singly or in combination of two or more of them.

When the photo acid generator is used, the ratio is 0.01 to 5 parts by mass, 0.1 to 3 parts by mass, or 0.5 to 1 part by mass relative to 100 parts by mass of the condensation product (polyorganosiloxane).

The silane may be hydrolyzed and condensed with a catalyst in a solvent, and the resulting hydrolysis-condensation product (polymer) may be subjected to distillation under reduced pressure, for example, to simultaneously remove alcohols as by-products, the hydrolysis catalyst used, and water used. Acid or base catalyst used for the hydrolysis may also be removed by neutralization or ion exchange.

The underlayer film-forming composition of the present invention may further contain acids (organic acids), water, alcohols, or a combination of them in order to stabilize the underlayer film-forming composition containing the hydrolysis-condensation product.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred, for example. The organic acid is added in an amount of 0.5 to 10.0 parts by mass relative to 100 parts by mass of the condensation product (polyorganosiloxane). Usable examples of the water to be added include pure water, ultrapure water, and ion-exchanged water. The amount may be 1 to 30 parts by mass relative to 100 parts by mass of the underlayer film-forming composition.

The alcohol to be added is preferably alcohols that can easily evaporate by heat after coating and is exemplified by methanol, ethanol, propanol, isopropanol, and butanol. The alcohol is added in an amount of 1 to 20 parts by mass relative to 100 parts by mass of the underlayer film-forming composition.

The use of the underlayer film-forming composition for self-assembled films of the present invention will next be described.

The underlayer film-forming composition for self-assembled films is applied onto a substrate and is baked to form an underlayer film, and onto the underlayer film, a self-assembled film-forming composition is applied and is baked to form a pattern structure constituting a self-assembled film.

Examples of the substrate include a silicon wafer substrate, a silicon/silicon dioxide coated substrate, a silicon nitride substrate, a glass substrate, an ITO substrate, a polyimide substrate, and a low dielectric constant material-(low-k material-) coated substrate.

Onto the substrate, the underlayer film-forming composition of the present invention is applied with an appropriate coating method such as a spinner and a coater and then is baked to form an underlayer film.

The baking conditions are appropriately selected from a baking temperature of 80° C. to 300° C. or 80° C. to 250° C. and a baking time of 0.3 to 60 minutes. The baking temperature is preferably 150° C. to 250° C., and the baking time is preferably 0.5 to 2 minutes. The underlayer film formed here has a film thickness of, for example, 10 to 1,000 nm, 20 to 500 nm, 10 to 300 nm, or 5 to 100 nm.

Next, on the underlayer film, a layer of a self-assembled film is formed, for example. The layer of a self-assembled film is formed by applying a solution of a self-assembled film-forming composition onto the underlayer film and baking the composition. The baking temperature is appropriately selected from 80 to 140° C., and the baking time is appropriately selected from 0.3 to 60 minutes, for example. The baking temperature is preferably 80 to 120° C., and the baking time is preferably about 0.5 to 2 minutes.

The self-assembled film has a film thickness of 30 to 10,000 nm, 20 to 2,000 nm, or about 10 to 200 nm, for example.

The self-assembled film used in the present invention may be a block polymer including an organic polymer chain (A) that contains an organic monomer (a) as a unit structure and an organic polymer chain (B) that contains an organic monomer (b) different from the organic monomer (a) as a unit structure and is bonded to the organic polymer chain (A).

The self-assembled film-forming composition may have a solid content of 0.1 to 70% by mass, 0.1 to 50% by mass, or 0.1 to 30% by mass. The solid content is the ratio of a residue obtained by removing solvents from the film-forming composition.

The ratio of the block copolymer may be 30 to 100% by mass, 50 to 100% by mass, 50 to 90% by mass, or 50 to 80% by mass in the solid content.

The block copolymer may contain two or three or more types of blocks. The number of blocks in the block copolymer may be 2 or 3 or more.

By changing the polymer chain (B), an adjacent polymer chain (C) containing a monomer (c) as a unit structure can be used, for example.

As the block polymer, AB, ABAB, ABA, ABC, and other patterns can be obtained.

The block copolymer can be synthesized by living radical polymerization or living cationic polymerization that includes initiation reaction and growth reaction alone in the polymerization process and that involves no side reaction deactivating a growth terminal. The growth terminal can maintain a growth active reaction during a polymerization reaction. By prohibiting chain transfer, a polymer (A) having a uniform length can be obtained. By adding an additional monomer (b), the monomer (b) undergoes polymerization by using the growth terminal of the polymer (A), and consequently a block copolymer (AB) can be formed.

For example, when the types of blocks are two types of A and B, the polymer chain (A) and the polymer chain (B) may have a molar ratio of 1:9 to 9:1, preferably 3:7 to 5:5.

A homopolymer A or B is a polymerizable compound having at least one reactive group (a vinyl group or a vinyl group-containing organic group) that can undergo radical polymerization.

The block copolymer used in the present invention preferably has a weight average molecular weight Mn of 1,000 to 100,000 or 5,000 to 100,000. A block copolymer having a weight average molecular weight of less than 1,000 may have poor coating properties on an underlying substrate, and a block copolymer having a weight average molecular weight of 100,000 or more may have poor solubility in solvents.

Examples of the monomer (a) and the monomer (b) to form the block copolymer include compounds selected from acrylic acid and alkyl esters of the acid, methacrylic acid and alkyl esters of the acid, N,N-dimethyl acrylamide, dimethylaminoethyl methacrylate optionally converted into quaternary salts, methacrylamide, N-t-butylacrylamide, maleic acid and hemiesters of the acid, maleic anhydride, crotonic acid, itaconic acid, acrylamide, hydroxylated (meth)acrylate, diallyldimethylammonium chloride, vinylpyrrolidone, vinyl ether, maleimide, vinylpyridine, vinylimidazole, heterocyclic vinyl compounds, styrene sulfonate, allyl alcohol, vinyl alcohol, esters of $C_{1-13}$ alcohols with acrylic acid or methacrylic acid, fluoroacrylate, styrene, vinyl acetate, vinyl chloride, vinylidene chloride, vinyl propionate, α-methylstyrene, t-butylstyrene, isoprene, butadiene, cyclohexadiene, ethylene, propylene, and vinyltoluene.

When a block polymer having no crosslinkable group or having a crosslinkable group is used in the self-assembled film-forming composition used in the present invention, a polystyrene/poly(methyl methacrylate) copolymer, a polystyrene/polyisoprene copolymer, or a polystyrene/polybutadiene copolymer is preferred.

The self-assembled film-forming composition used in the present invention may contain the block copolymer and solvents and, as necessary, further contain crosslinkable compounds, crosslinking catalysts, absorbent compounds, surfactants, hardness adjusting polymer compounds, antioxidants, thermal polymerization inhibitors, surface modifiers, defoaming agents, and other additives.

The self-assembled film-forming composition used in the present invention is typically prepared by dissolving or dispersing the block copolymer containing two homopolymer chains (A) and (B) in an organic solvent. The organic solvent is exemplified by at least one solvent selected from the group consisting of alcoholic solvents, ketone solvents, amide solvents, ester solvents, and aprotic solvents.

The thermoset (self-assembled) film-forming composition of the present invention may further contain β-diketones, colloidal silica, colloidal alumina, organic polymers, surfactants, silane coupling agents, radical generators, triazene compounds, alkali compounds, and other components.

Examples of the solvent used in the self-assembled film-forming composition used in the present invention include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcoholic solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcoholic solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone;

ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propane sultone.

In particular, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred in terms of the storage stability of a solution of the composition.

For thermal curing of the self-assembled film-forming composition, a catalyst may be used. The catalyst used for the thermal curing may be the catalyst used to cure the underlayer film.

In order to improve adhesion, wettability with respect to an underlying substrate, flexibility, planarization, and other characteristics, a polymer prepared by radical polymerization of the polymerizable compound described below and containing no block copolymer is used, as necessary, and may be mixed with the self-assembled film-forming composition containing the block copolymer. The mixing ratio is 10 to 1,000 parts by mass and preferably 10 to 100 parts by mass relative to 100 parts by mass of the block copolymer.

The polymer containing no block polymer may be a crosslinkable polymer. Examples of the polymer include polymers of hydroxystyrene, tris-(2-hydroxyethyl)-isocyanuric acid, and tris-(2-hydroxyethyl)-isocyanurate (meth)acrylate.

For the polymer containing no block polymer, specific examples of the polymerizable compound include, in addition to the above-mentioned compound, ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di(meth)acrylate, tetrapropylene glycol di(meth)acrylate, nonapropylene glycol di(meth)acrylate, polypropylene glycol di(meth)acrylate, 2,2-bis[4-(acryloxydiethoxy)phenyl]propane, 2,2-bis[4-(methacryloxydiethoxy)phenyl]propane, 3-phenoxy-2-propanoyl acrylate, 1,6-bis(3-acryloxy-2-hydroxypropyl)-hexyl ether, pentaerythritol tri(meth)acrylate, trimethylolpropane tri(meth)acrylate, glycerol tri(meth)acrylate, pentaerythritol tetra(meth)acrylate, dipentaerythritol penta(meth)acrylate, and dipentaerythritol hexa (meth) acrylate. Here, for example, the ethylene glycol di(meth)acrylate means ethylene glycol diacrylate and ethylene glycol dimethacrylate.

Examples of the polymerizable compound having an ethylenically unsaturated bond also include urethane compounds that can be obtained by reacting a polyvalent isocyanate compound with a hydroxyalkyl unsaturated carboxylic ester compound, compounds that can be obtained by reacting a polyvalent epoxy compound with a hydroxyalkyl unsaturated carboxylic ester compound, diallyl ester compounds such as diallyl phthalate, and divinyl compounds such as divinyl phthalate.

Examples of the polymerizable compound containing no block polymer but having a vinyl ether structure include vinyl 2-chloroethyl ether, vinyl n-butyl ether, 1,4-cyclohexanedimethanol divinyl ether, vinyl glycidyl ether, bis(4-(vinyloxymethyl)cyclohexylmethyl) glutarate, tri(ethylene glycol) divinyl ether, divinyl adipate, diethylene glycol divinyl ether, tris(4-vinyloxy)butyl trimellitate, bis(4-(vinyloxy)butyl) terephthalate, bis(4-(vinyloxy)butyl isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether.

In the self-assembled film used in the present invention, crosslinking agents may be used as an optional component. Examples of the crosslinking agent include nitrogen-containing compounds having a nitrogen atom substituted with a hydroxymethyl group or an alkoxymethyl group. The crosslinking agent is nitrogen-containing compounds having the nitrogen atom substituted with a group such as a hydroxymethyl group, a methoxymethyl group, an ethoxymethyl group, a butoxymethyl group, and a hexyloxymethyl group. The crosslinking agent can form a crosslinkage with a block copolymer or a crosslinkable polymer, but when the block copolymer has no crosslinkable group, the crosslinking agent can be self-crosslinked to form a matrix, thus fixing the block copolymer.

The crosslinking agent can be used in an amount of 1 to 50 parts by mass, 3 to 50 parts by mass, 5 to 50 parts by mass, 10 to 40 parts by mass, or 20 to 30 parts by mass relative to 100 parts by mass of the block copolymer. By changing the type and the amount of the crosslinking agent, elastic modulus and step coverage can be controlled.

The composition may further contain crosslinking catalysts that can generate cations or radicals by heat baking (heating) to initiate a thermal polymerization reaction of the self-assembled film-forming composition used in the present invention. The use of the crosslinking catalyst accelerates the reaction by the crosslinking agent.

Usable examples of the crosslinking catalyst include acid compounds such as p-toluenesulfonic acid, trifluoromethanesulfonic acid, pyridinium p-toluenesulfonate, salicylic acid, camphorsulfonic acid, sulfosalicylic acid, citric acid, benzoic acid, and hydroxybenzoic acid.

The crosslinking catalyst may be aromatic sulfonic acid compounds. Specific examples of the aromatic sulfonic acid compound include p-toluenesulfonic acid, pyridinium p-toluenesulfonate, sulfosalicylic acid, 4-chlorobenzenesulfonic acid, 4-hydroxybenzenesulfonic acid, benzenedisulfonic acid, 1-naphthalenesulfonic acid, and pyridinium 1-naphthalenesulfonate. The crosslinking catalysts may be used singly or in combination of two or more of them.

The crosslinking catalyst may be used in an amount of 0.01 to 10 parts by mass, 0.05 to 5 parts by mass, 0.1 to 3 parts by mass, 0.3 to 2 parts by mass, or 0.5 to 1 part by mass relative to 100 parts by mass of the block copolymer.

The present invention comprises applying the underlayer film-forming composition for self-assembled films onto a processing substrate, thus forming a coating film, radiating light to the coating film or heat baking the coating film, thus recording pattern information, forming a self-assembled film, and further radiating light to the coating film or heat baking the coating film, thus forming a self-assembled film. Through the steps, liquid crystal displays, recording materials for hard disks, solid-state image sensing devices, solar cell panels, light emitting diodes, organic light emitting devices, luminescent films, fluorescent films, MEMSs, actuators, anti-reflective materials, resists, resist underlayer films, resist upper layer films, or templates (molds) for nanoimprint are produced.

In the present invention, the underlayer film of the present application on which pattern information is to be recorded by electron beam lithography or laser exposure can be applied before the formation of the self-assembled film. Prior to the formation of the self-assembled film, on the underlayer film, a resist is applied, and lithography is performed. Alternately, no resist is applied, and lithography is performed. The block copolymer itself used in the present invention has pattern forming ability by self-assembling, and thus the resist may not necessarily be required due to the ability.

Typical applications of the present invention will next be described.

Onto processing substrates (for example, silicon/silicon dioxide coated substrates, silicon wafer substrates, silicon nitride substrates, glass substrates, ITO substrates, polyimide substrates, and low dielectric constant material-(low-k material-) coated substrates) used for the production of semiconductors, liquid crystal displays, recording materials for hard disks, solid-state image sensing devices, solar cell panels, light emitting diodes, organic light emitting devices, luminescent films, fluorescent films, MEMSs, actuators, anti-reflective materials, resists, resist underlayer films, resist upper layer films, or templates (molds) for nanoimprint, the underlayer film (Brush Layer, Migaku/Layer) of the present application on which pattern information is to be recorded with a variation of unevenness or a variation of surface energy by electron beam or laser exposure can be applied. Onto the underlayer film, a thermoset (self-assembled) film-forming composition is applied with an appropriate coating method such as a spinner, a coater, a spray, and an inkjet printer, forming a coating film.

When the variation of surface energy is used, the polysiloxane in the underlayer film preferably has a water contact angle between a water contact angle of the organic polymer chain (A) of the block polymer and a water contact angle of the organic polymer chain (B) of the block polymer.

In the present invention, an underlayer film is formed by applying the underlayer film-forming composition of the present application onto a substrate and baking the composition, a self-assembled film-forming composition is formed on the underlayer film, and the self-assembled film forms a pattern. The self-assembled film-forming composition may be applied according to a preset pattern guide and may form a self-assembled pattern. The pattern guide can be formed by the application of a resist, exposure, and development.

The self-assembled film that is self-assembled along the pattern guide has an area that is preferentially removed by a developer, an etching gas, or other method according to the type of a unit structure in a polymer chain constituting the self-assembled film. These unit structures may be removed by development to shrink the width of a resist pattern or to form sidewalls.

The photoresist to be applied and formed may be any photoresist that is sensitive to the light used for exposure, and both negative photoresists and positive photoresists can be used. Next, exposure is carried out through a predetermined mask. Subsequently, development is carried out with an alkaline developer, for example.

Before the (self-assembled) film-forming composition including a block polymer is applied onto a processing substrate, an underlayer film of the underlayer film-forming composition of the present application is applied onto the processing substrate in order to make the block polymer form patterning of a perpendicular lamellar structure or a perpendicular cylinder structure.

The underlayer film formed from the underlayer film-forming composition of the present invention contains, for example, phenylsilane at a particular ratio and thus allows the block polymer to self-assemble. By varying the surface nature of the underlayer film, pattern information can also be input.

In order to arrange a pattern at an intended position in the underlayer film of the present application on a processing substrate, an external stimulus such as heat, ultraviolet rays, laser, and radiation rays are applied so as to overlap the arranging position to cause a variation of unevenness or surface energy (hydrophilic/hydrophobic), and thus a component of the polymer chain (A) and a component of the polymer chain (B) in the (self-assembled) film-forming composition including the block polymer of the present invention can be arranged at respective intended positions.

The polysiloxane in the underlayer film used in the present invention includes the phenyl group-containing silane. The phenyl group bonded to the silicon atom may sensitively respond to an external stimulus, and this changes the shape to record the information.

Subsequently, the self-assembled film of which alkali dissolution rate, solvent dissolution rate, or gas etching rate changes with the type of a unit structure of a polymer chain in the self-assembled film is arranged at an intended position; a resist film is formed; ultraviolet rays or radiation rays are radiated onto the resist so as to overlap the arranging position; development is carried out to dissolve the resist together with the self-assembled film, of which alkali dissolution rate or solvent dissolution rate is changed; this completes high contrast development; and consequently an excellent resist pattern can be formed.

EXAMPLES

The present invention will now be described in more detail with reference to examples, but the present invention is not limited to these examples.

Synthesis Example 1

Into a 100-ml flask, 1.98 g of phenyltrimethoxysilane (10 mol % relative to the total silane), 13.34 g of vinyltrimethoxysilane (90 mol % relative to the total silane), and 22.99 g of acetone were added, and 5.41 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 60 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-1)) had a weight average molecular weight Mw of 1,200 in terms of polystyrene by GPC.

Formula (D-1)

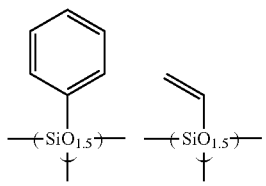

Synthesis Example 2

Into a 100-ml flask, 5.95 g of phenyltrimethoxysilane (30 mol % relative to the total silane), 12.48 g of methyltrimethoxysilane (70 mol % relative to the total silane), and 27.64 g of acetone were added, and 5.41 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 72 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-2)) had a weight average molecular weight Mw of 1,200 in terms of polystyrene by GPC.

Formula (D-2)

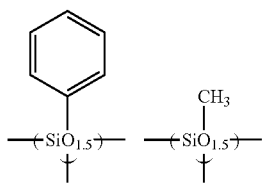

Synthesis Example 3

Into a 100-ml flask, 13.88 g of phenyltrimethoxysilane (70 mol % relative to the total silane), 5.35 g of methyltrimethoxysilane (30 mol % relative to the total silane), and 28.84 g of acetone were added, and 5.41 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 75 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-3)) had a weight average molecular weight Mw of 1,200 in terms of polystyrene by GPC.

Formula (D-3)

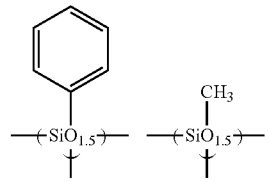

Synthesis Example 4

Into a 100-ml flask, 14.87 g of phenyltrimethoxysilane (75 mol % relative to the total silane), 5.21 g of tetraethoxysilane (25 mol % relative to the total silane), and 28.84 g of acetone were added, and 5.47 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 72 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-4)) had a weight average molecular weight Mw of 1,200 in terms of polystyrene by GPC.

Formula (D-4)

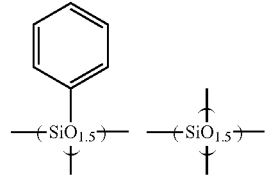

Synthesis Example 5

Into a 100-ml flask, 19.83 g of phenyltrimethoxysilane (100 mol % relative to the total silane) and 27.49 g of acetone were added, and 5.41 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 77 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-5)) had a weight average molecular weight Mw of 1,200 in terms of polystyrene by GPC.

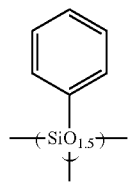

Formula (D-5)

Comparative Synthesis Example 1

Into a 100-ml flask, 17.83 g of methyltrimethoxysilane (1,000 mol % relative to the total silane) and 26.75 g of acetone were added, and 5.41 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 69 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-6)) had a weight average molecular weight Mw of 1,500 in terms of polystyrene by GPC.

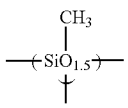

Formula (D-6)

Comparative Synthesis Example 2

Into a 100-ml flask, 20.83 g of tetraethoxysilane (100 mol % relative to the total silane) and 31.25 g of acetone were added, and 5.41 g of 0.01 mol/l hydrochloric acid was added dropwise while the mixed solution was stirred with a magnetic stirrer. After the addition, the flask was transferred into an oil bath set at 85° C., and the mixture was reacted for 240 minutes under reflux by heating. The reaction solution was cooled to room temperature. To the reaction solution, 81 g of propylene glycol monomethyl ether acetate was added. Methanol, ethanol, water, and hydrochloric acid as reaction by-products were distilled off under reduced pressure, and the reaction solution was concentrated, yielding a solution of the hydrolysis-condensation product (polymer) in propylene glycol monomethyl ether acetate. To the solution, propylene glycol monoethyl ether was added to make a solvent ratio of propylene glycol monomethyl ether acetate/propylene glycol monoethyl ether of 20/80, thereby adjusting the concentration to 15 percent by mass in terms of solid residue at 140° C. The obtained polymer (corresponding to Formula (D-7)) had a weight average molecular weight Mw of 1,500 in terms of polystyrene by GPC.

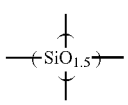

Formula (D-7)

(Preparation of Underlayer Film)

The silicon polymers obtained in Synthesis Examples 1 to 5 and Comparative Synthesis Examples 1 and 2, an acid, curing catalysts, solvents, and water were mixed at a ratio shown in Table 1. The mixture was filtered through a 0.1-μm fluorine resin filter, yielding respective solutions of underlayer film-forming compositions of Examples 1 to 8 and Comparative Examples 1 and 2.

In Table 1, maleic acid is abbreviated as MA; benzyltriethylammonium chloride is abbreviated as BTEAC; N-(3-triethoxysilylpropyl)-4,5-dihydroimidazole is abbreviated as Imi-Si; monotriphenylsulfonium maleate is abbreviated as TPSMA; triphenylsulfonium trifluoromethanesulfonate is abbreviated as TPS105; 4,4'-sulfonyldiphenol is abbreviated as BPS; propylene glycol monomethyl ether acetate is abbreviated as PGMEA; propylene glycol monomethyl ether is abbreviated as PGME; and propylene glycol monoethyl ether is abbreviated as PGEE. The water used was ultrapure water. In Table 1, the amounts of the polymers are represented in terms of solid content, and the values are represented in terms of parts by mass. Each amount is represented in terms of parts by mass.

TABLE 1

| | Polymer | Acid | Curing catalyst | Additive | Solvent | | | Water |
|---|---|---|---|---|---|---|---|---|
| Example 1 (Parts by mass) | D-1 2 | MA 0.06 | BTEAC 0.012 | | PGMEA 7 | PGEE 70 | PGME 13 | Water 10 |
| Example 2 (Parts by mass) | D-2 2 | MA 0.06 | BTEAC 0.012 | | PGMEA 7 | PGEE 70 | PGME 13 | Water 10 |
| Example 3 (Parts by mass) | D-3 2 | MA 0.06 | BTEAC 0.012 | | PGMEA 7 | PGEE 70 | PGME 13 | Water 10 |
| Example 4 (Parts by mass) | D-4 2 | MA 0.06 | BTEAC 0.012 | | PGMEA 7 | PGEE 70 | PGME 13 | Water 10 |
| Example 5 (Parts by mass) | D-5 2 | MA 0.06 | BTEAC 0.012 | | PGMEA 7 | PGEE 70 | PGME 13 | Water 10 |
| Example 6 (Parts by mass) | D-4 2 | MA 0.06 | Imi-Si 0.012 | | PGMEA 7 | PGEE 70 | PGME 13 | Water 10 |
| Example 7 (Parts by mass) | D-4 2 | MA 0.06 | TPSMA 0.012 | | PGMEA 7 | PGEE 70 | PGME 13 | Water 10 |
| Example 8 (Parts by mass) | D-4 2 | MA 0.06 | Imi-Si 0.012 | TPS105 0.02 | PGMEA 7 | PGEE 70 | PGME 13 | Water 10 |
| Example 9 (Parts by mass) | D-4 2 | MA 0.06 | Imi-Si 0.012 | BPS 0.10 | PGMEA 7 | PGEE 70 | PGME 13 | Water 10 |
| Comparative Example 1 (Parts by mass) | D-6 2 | MA 0.06 | BTEAC 0.012 | | PGMEA 7 | PGEE 70 | PGME 13 | Water 10 |
| Comparative Example 2 (Parts by mass) | D-7 2 | MA 0.06 | BTEAC 0.012 | | PGMEA 7 | PGEE 70 | PGME 13 | Water 10 |

(Solvent Resistance Test)

Each underlayer film-forming composition prepared in Examples 1 to 9 and Comparative Examples 1 and 2 was applied onto a silicon wafer by spin coating and was baked on a hot plate at 240° C. for 1 minute, yielding an underlayer film. The coated substrate was then immersed in propylene glycol monomethyl ether acetate used as the solvent of an overcoating self-assembled film-forming composition for 1 minute. An underlayer film having a change in the film thickness of 1 nm or less before and after the immersion was evaluated as "good" and represented as "○", whereas an underlayer film having a change in the film thickness of more than 1 nm was evaluated as "poor" and represented as "X".

TABLE 2

| Solvent resistance test | |
|---|---|
| Underlayer film obtained from Example 1 | ○ |
| Underlayer film obtained from Example 2 | ○ |
| Underlayer film obtained from Example 3 | ○ |
| Underlayer film obtained from Example 4 | ○ |
| Underlayer film obtained from Example 5 | ○ |
| Underlayer film obtained from Example 6 | ○ |
| Underlayer film obtained from Example 7 | ○ |
| Underlayer film obtained from Example 8 | ○ |
| Underlayer film obtained from Example 9 | ○ |
| Underlayer film obtained from Comparative Example 1 | X |
| Underlayer film obtained from Comparative Example 2 | ○ |

(Preparation of Block Copolymer 1)

In 32.33 g of propylene glycol monomethyl ether, 1.0 g of polystyrene/poly(methyl methacrylate) copolymer (manufactured by POLYMER SOURCE INC., PS (18,000)-b-PMMA (18,000), polydispersity=1.07) was dissolved as a block copolymer, giving a 3% by mass solution. The solution was filtered through a polyethylene microfilter having a pore size of 0.02 μm, yielding a solution of a self-assembled film-forming composition as a block copolymer 1.

(Preparation of Block Copolymer 2)

In 42.03 g of propylene glycol monomethyl ether, 1.0 g of polystyrene/poly(methyl methacrylate) copolymer (manufactured by POLYMER SOURCE INC., PS (20,200)-b-PMMA (50,500), polydispersity=1.07) as a block copolymer and 0.3 g of polymethyl methacrylate (manufactured by POLYMER SOURCE INC., PMMA (1,300), polydispersity=1.20) were dissolved, giving a 3% by mass solution. The solution was filtered through a polyethylene microfilter having a pore size of 0.02 μm, yielding a solution of a self-assembled film-forming composition as a block copolymer 2.

(Self-Assembling Evaluation of Block Copolymer)

Each of the underlayer film-forming compositions obtained in Examples 1 to 9 and Comparative Examples 1 and 2 was applied onto a silicon wafer, and the coated substrate was heated on a hot plate at 240° C. for 1 minute, giving an underlayer film (A layer) to be present as the underlayer of a self-assembled film. The underlayer film had a film thickness of 32 nm.

Onto the underlayer film, the self-assembled film-forming composition of the block copolymer 1 or 2 was applied with a spinner, and the coated substrate was heated on a hot plate at 100° C. for 1 minute, giving a self-assembled film (B layer) having a film thickness of 60 nm. The resulting substrate was subsequently heated on a hot plate at 240° C. for 5 minutes, and thus a microphase-separated structure of the block copolymer was induced.
(Observation 1 of Microphase-Separated Structure)
The silicon wafer having the induced microphase-separated structure was etched with an etcher (RIE-10NR) manufactured by Samco Inc. for 8 seconds using an $O_2$ gas as the etching gas, and thus the PMMA region was preferentially etched. Subsequently, the shape was observed under a scanning electron microscope (S-4800 manufactured by Hitachi, Ltd.).

TABLE 3

Shape observation of block copolymer (self-assembled film) on underlayer film

|  | Block copolymer 1 | Block copolymer 2 |
| --- | --- | --- |
| Underlayer film obtained from Example 1 | Perpendicular lamellar | Perpendicular cylinder |
| Underlayer film obtained from Example 2 | Perpendicular lamellar | Perpendicular cylinder |
| Underlayer film obtained from Example 3 | Perpendicular lamellar | Perpendicular cylinder |
| Underlayer film obtained from Example 4 | Perpendicular lamellar | Perpendicular cylinder |
| Underlayer film obtained from Example 5 | Perpendicular lamellar | Perpendicular cylinder |
| Underlayer film obtained from Example 6 | Perpendicular lamellar | Perpendicular cylinder |
| Underlayer film obtained from Example 7 | Perpendicular lamellar | Perpendicular cylinder |
| Underlayer film obtained from Example 8 | Perpendicular lamellar | Perpendicular cylinder |
| Underlayer film obtained from Example 9 | Perpendicular lamellar | Perpendicular cylinder |
| Underlayer film obtained from Comparative Example 1 | Horizontal lamellar | Horizontal cylinder |
| Underlayer film obtained from Comparative Example 2 | Horizontal lamellar | Horizontal cylinder |

The underlayer films obtained from Examples 1 to 9 can induce the microphase-separated structure of the block copolymer in a perpendicular direction to the substrate. The underlayer film induces both the lamellar structure and the cylinder structure as the microphase-separated structure in a perpendicular direction to the substrate regardless of the type of the block copolymer. As shown by the underlayer films obtained from Examples 1 to 9, the ability of perpendicular induction with respect to the substrate is not restricted by any components besides the phenyltrimethoxysilane.

In contrast, as shown by the underlayer films obtained from Comparative Examples, the film containing no phenylmethoxysilane fails to induce the microphase-separated structure of the block copolymer in a perpendicular direction to the substrate.
(Observation 2 of Microphase-Separated Structure)
The underlayer film-forming composition of Example 3 was applied onto a silicon wafer with a spinner, and the coated substrate was heated on a hot plate at 240° C. for 1 minute, giving an underlayer film (A) layer to be present as the underlayer of a self-assembled film.
Subsequently, a guide pattern for orientation was formed. For the guide pattern, a commercially available ArF resist was used. First, a photoresist solution was applied with a spinner, and the coated substrate was heated on a hot plate at 100° C. for 1 minute, giving a photoresist film having a film thickness of 85 nm. Next, exposure was carried out with an NSR—S307E scanner manufactured by NIKON CORPORATION (a wavelength of 193 nm, NA, σ: 0.85, 0.93/0.85). The exposed substrate was baked on a hot plate at 100° C. for 60 seconds and cooled. The substrate was developed with butyl acetate (solvent developer) for 60 seconds, giving a negative pattern on the underlayer film. The resist pattern formed in this manner was observed under a scanning electron microscope (SEM), and the formation of a straight line pattern having a line width of about 110 nm and a pattern pitch of about 220 nm was confirmed.

Figure 7:
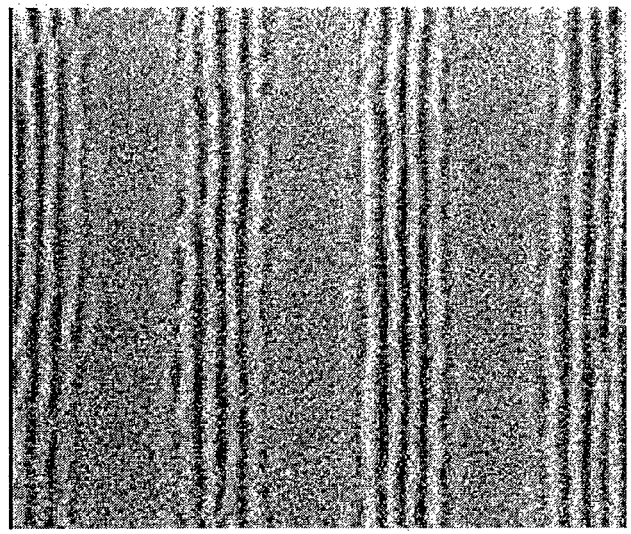
FIG. 7 is an electron micrograph (a magnification of 200,000 times) showing a state in which a guide pattern was formed on the underlayer film obtained from Example 3, and then a perpendicular lamellar structure of the block copolymer 1 was formed along the guide pattern.

Next, in order to four a self-assembled film including the block copolymer 1 among the formed guide patterns, a solution of a self-assembled film composition was prepared.
In 24.50 g of butyl acetate, 0.5 g of polystyrene/poly (methyl methacrylate) copolymer (manufactured by POLYMER SOURCE INC., PS (18,000)-b-PMMA (18,000), polydispersity=1.07) was dissolved as a block copolymer, giving a 2% by mass solution. The solution was filtered through a polyethylene microfilter having a pore size of 0.02 μm, yielding a solution of a self-assembled film-forming composition. The block copolymer solution was applied onto the silicon wafer having the guide pattern with a spinner. The coated substrate was heated on a hot plate at 100° C. for 1 minute, and thus a self-assembled film (B) layer having a film thickness of 40 nm was formed among the guide patterns. The resulting substrate was further heated under a nitrogen atmosphere on a hot plate at 240° C. for 5 minutes, and thus a microphase-separated structure of the block copolymer was induced.
The silicon wafer having the induced microphase-separated structure was etched with an etcher (RIE-10NR) manufactured by Samco Inc. for 8 seconds using an $O_2$ gas as the etching gas, and thus the PMMA region was preferentially etched. The shape was observed under a scanning electron microscope (Hitachi, Ltd., S-9380). This revealed that a perpendicular lamellar structure in which polystyrene regions and PMMA regions are alternately repeated was arranged at a pitch of 28 nm along the resist guide pattern. The electron micrograph is shown in FIG. 7.

(Observation 3 of Microphase-Separated Structure)

The underlayer film-forming composition of Example 3 was applied onto a silicon wafer with a spinner, and the coated substrate was heated on a hot plate at 240° C. for 1 minute, giving an underlayer film (A) layer to be present as the underlayer of a self-assembled film. Next, the underlayer film was exposed to ArF light at 100 mJ/cm$^2$ through a mask using an NSR-S307E scanner manufactured by NIKON CORPORATION (a wavelength of 193 nm, NA, σ: 0.85, 0.93/0.85). Subsequently, the exposed substrate was developed with a 2.38% by mass aqueous tetramethylammonium hydroxide solution (developer), and then was heated at 100° C. for 1 minute.

Figure 8:
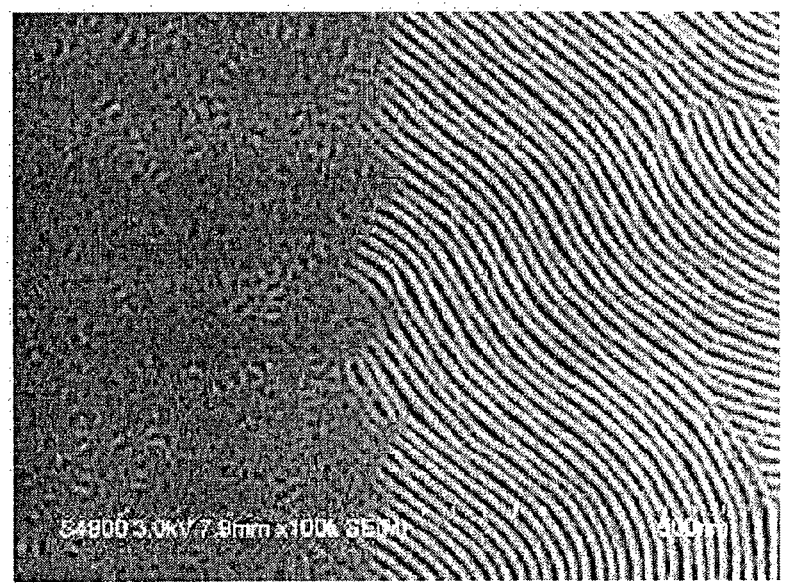
FIG. 8 is an electron micrograph (a magnification of 100,000 times) showing a state in which ArF light was radiated onto the underlayer film obtained from Example 3, and a perpendicular lamellar structure of the block copolymer 1 was selectively formed in an unexposed area alone.

Onto the treated substrate, the self-assembled film-forming composition of the block copolymer 1 was applied with a spinner. The coated substrate was heated on a hot plate at 100° C. for 1 minute, and thus a self-assembled film (B) layer having a film thickness of 60 nm was formed. The resulting substrate was heated under a nitrogen atmosphere on a hot plate at 240° C. for 5 minutes, and thus a microphase-separated structure of the block copolymer was induced. The silicon wafer having the induced microphase-separated structure was etched for 8 seconds with an etcher (RIE-10NR) manufactured by Samco Inc. using an O$_2$ gas as the etching gas, and thus the PMMA region was preferentially etched. The shape was observed under a scanning electron microscope (S-4800 manufactured by Hitachi, Ltd.). In the unexposed area, a pattern composed of a perpendicular lamellar structure of the block copolymer was observed, but in the exposed area, a horizontal lamellar structure was induced, and no pattern was observed. The electron micrograph is shown in FIG. 8.

INDUSTRIAL APPLICABILITY

Self-assembled films are used for liquid crystal displays, recording materials for hard disks, solid-state image sensing devices, solar cell panels, light emitting diodes, organic light emitting devices, luminescent films, fluorescent films, MEMSs, actuators, anti-reflective materials, resists, resist underlayer films, resist upper layer films, templates for nanoimprint, or other devices. In the present invention, a polysiloxane is used in an underlayer film of the self-assembled film. The underlayer film particularly containing phenyltrimethoxysilane in a ratio of 10% or more can induce a microphase-separated structure of a block copolymer in a perpendicular direction to a substrate.

The invention claimed is:

1. A self-assembled film structure comprising:
an underlayer film formed by baking an underlayer film-forming composition comprising:
a polysiloxane;
an acid;
a curing catalyst;
water; and
a solvent,
wherein the polysiloxane is a hydrolysis-condensation product of a silane containing a silane of Formula (1) in a ratio of 10 to 100% by mol relative to a total silane:

$$R^2Si(R^1)_3 \quad \text{Formula (1)}$$

where R$^1$ is an alkoxy group, an acyloxy group, or a halogen atom; and R$^2$ is an organic group containing a benzene ring optionally having a substituent and is a group bonded to the silicon atom through a Si—C bond, and
a self-assembled film over the underlayer film formed by baking a self-assembled film-forming composition comprising a block polymer including an organic polymer chain (A) that contains an organic monomer (a) as a unit structure and an organic polymer chain (B) that contains an organic monomer (b) different from the organic monomer (a) as a unit structure and is bonded to the organic polymer chain (A),
wherein the polysiloxane has a water contact angle between a water contact angle of the organic polymer chain (A) of the block polymer and a water contact angle of the organic polymer chain (B) of the block polymer.

2. The self-assembled film structure according to claim 1, wherein
the polysiloxane is a hydrolysis-condensation product of silanes containing the silane of Formula (1), a silane of Formula (2), and a silane of Formula (3) in a ratio of the silane of Formula (1):the silane of Formula (2):the silane of Formula (3) of 10 to 100:0 to 90:0 to 50 in terms of % by mol relative to the total silane:

$$R^4Si(R^3)_3 \quad \text{Formula (2)}$$

$$Si(R^5)_4 \quad \text{Formula (3)}$$

(where R$^3$ and R$^5$ are each an alkoxy group, an acyloxy group, or a halogen atom; and R$^4$ is an organic group containing a hydrocarbon optionally having a substituent and is a group bonded to the silicon atom through a Si—C bond).

3. The self-assembled film structure according to claim 1, wherein
the polysiloxane is a hydrolysis-condensation product of silanes containing the silane of Formula (1) and the silane of Formula (2) in a ratio of 10 to 100:0 to 90 in terms of % by mol relative to the total silane:

$$R^4Si(R^3)_3 \quad \text{Formula (2)}$$

where R$^3$ is an alkoxy group, an acyloxy group, or a halogen atom; and R$^4$ is an organic group containing a hydrocarbon optionally having a substituent and is a group bonded to the silicon atom through a Si—C bond.

4. The self-assembled film structure according to claim 1, wherein
R$^2$ is a phenyl group.

5. The self-assembled film structure according to claim 2, wherein
R$^4$ is a methyl group or a vinyl group.

6. The self-assembled film structure according to claim 1, wherein
the block polymer is a block copolymer of a combination of a polystyrene (A) and a polymethyl methacrylate (B), a combination of a polystyrene (A) and a polyisoprene (B), or a combination of a polystyrene (A) and a polybutadiene (B).

7. A method for forming a pattern structure comprising the self-assembled film structure of claim 1, the method comprising:
applying the underlayer film-forming composition onto a substrate and baking the underlayer film-forming composition to form the underlayer film; and subsequently applying the self-assembled film-forming composition onto the underlayer film and baking the self-assembled film-forming composition to form the self-assembled film.

\* \* \* \* \*